United States Patent [19]
Shibib

[11] Patent Number: 5,420,457
[45] Date of Patent: May 30, 1995

[54] LATERAL HIGH-VOLTAGE PNP TRANSISTOR

[75] Inventor: Muhammed A. Shibib, Wyomissing Hills, Pa.

[73] Assignee: AT&T Corp., Murray Hill, N.J.

[21] Appl. No.: 152,992

[22] Filed: Nov. 12, 1993

[51] Int. Cl.⁶ .................................... H01L 29/72
[52] U.S. Cl. .............................. 257/488; 257/518; 257/557; 257/587; 257/588; 257/659
[58] Field of Search .............. 257/588, 587, 659, 557, 257/518, 488, 409

[56] References Cited

U.S. PATENT DOCUMENTS

| | | | |
|---|---|---|---|
| 3,573,571 | 4/1971 | Brown et al. | 257/409 X |
| 4,665,424 | 5/1987 | Hirao | 257/518 |
| 4,782,030 | 11/1988 | Katsumata et al. | 257/588 X |
| 4,789,885 | 12/1988 | Brighton et al. | 257/588 |
| 4,990,991 | 2/1991 | Ikeda et al. | 257/518 X |

FOREIGN PATENT DOCUMENTS

| | | | |
|---|---|---|---|
| 2823629 | 12/1978 | Germany | 257/488 |
| 61-168257 | 7/1986 | Japan | 257/588 |

OTHER PUBLICATIONS

IEEE Transactions on Electron Devices, *An Analog, Digital BCDMOS Technology With Dielectric Isolation–Devices and Processes*, Chih-Yuan Lu et al., vol. 35, No. 2, Feb. 1988.

*Primary Examiner*—William Mintel

[57] ABSTRACT

A semiconductor device comprising a semiconductor substrate with a base region, a collector region and an emitter region in a lateral arrangement. The base region having a first conductivity type, and the collector and emitter regions having a second conductivity type. A first conductor layer is patterned over the substrate with a base contact portion, a collector contact portion and an emitter contact portion, with the base contact portion, the collector contact portion and the emitter contact portion contacting the base region, the collector region and the emitter region, respectively. A second conductor layer is patterned over a portion of the base region and is electrically coupled to the emitter contact portion, whereby the second conductor layer functions as an electrostatic shield for the base region.

15 Claims, 7 Drawing Sheets

μA

μA

LATERAL HIGH-VOLTAGE PNP TRANSISTOR

BACKGROUND OF THE INVENTION

1. Field of the Invention

The present invention generally relates to the field of semiconductor devices, and more particularly, to an improved performance, lateral, high-voltage PNP transistor.

2. Related Art

The design of lateral PNP transistors is complicated by the need to produce transistors which satisfy various performance requirements. One requirement is for high-voltage operation. Such devices must also produce sufficient current gain. Because the lateral PNP transistor (also referred to herein as "the transistor") is designed for high-voltage capability, the base drift region of the device must be lightly doped to sustain these high voltages. This low doping in the base drift region causes the base drift region to be vulnerable to electrostatic build-up in the overlying oxide. Such build-up can result in excessive off-state leakage current, degradation in breakdown voltage and a reduction in current gain from the overlying oxide into the base drift region. Thus, a further requirement is the need for full electrostatic charge shielding of the base drift region from chargers that can exist primarily in the dielectric layers (e.g., silicon dioxide layers) on top of the silicon surface.

To satisfy these requirements, a polycrystalline silicon shield (hereafter called a polysilicon shield) is used to protect the base drift region from presence of charges from the overlying the dielectric layers. However, lateral, high-voltage PNP transistors formed according to a BCDMOS (bipolar complementary double diffusion metal oxide silicon) technology demonstrate a kink in the $I_C$-$V_{CE}$ characteristic curves and low early voltage due to the potential of the polysilicon field plate needed to electrically shield the base surface region. (See "An Analog/Digital BCDMOS Technology with Dielectric Isolation—Devices and Processes," Lu et al., *I.E.E.E. Transactions on Electron Devices*, Vol. 35, No. 2, p. 230–239 (Feb. 1988).) The kink in the collector-emitter characteristics of the transistor disturbs the output impedance and current gain in the active region of operation of the transistor, and lower early voltage.

Thus, what is desired is a lateral, high-voltage PNP transistor having a structure which eliminates the "kink" demonstrated by existing devices.

SUMMARY OF THE INVENTION

The present invention is directed to a lateral, high-voltage PNP transistor having a polysilicon shield formed over the base drift region of the transistor and electrically connected to the emitter metal electrode. Electrically contacting the polysilicon shield to the emitter metal electrode eliminates the "kink" in the collector-emitter characteristic curves of conventional lateral high-polar PNP transistors, thus providing better output characteristics.

Another feature of the present invention is that the polysilicon shield is formed in a tiered fashion. The polysilicon shield is formed over a thick oxide layer in an outer region of the device where the polysilicon shield is formed over the base drift region-collector junction. The polysilicon shield is formed over a thin oxide layer at an inner portion of the transistor, where the polysilicon shield is formed over the base drift region-emitter P-N junction. The two-tiered polysilicon shield functions to improve the breakdown voltage of the device.

BRIEF DESCRIPTION OF THE FIGURES

The invention will be better understood if reference is made to the accompanying drawings in which.

DETAILED DESCRIPTION OF THE PREFERRED EMBODIMENTS

The preferred embodiment of the present invention is discussed in detail below. While specific steps, configurations and arrangements are discussed, it should be understood that this is done for illustration purposes only. A person skilled in the relevant art will recognize that other steps, configurations and arrangements may be used without departing from the spirit and scope of the invention.

Further, background material concerning semiconductor solid-state physics may be found in a number of references including two books by S. M. Sze, titled: *Physics of Semiconductor Devices*, John Wiley and Sons, Inc., New York (1981), and *Semiconductor Devices, Physics and Technology*, John Wiley and Sons, Inc., New York (1985), both of which are incorporated herein by reference.

The preferred embodiment of the invention is now described with reference to the figures where like reference numbers indicate identical or functionally similar features. Also in the figures, the left-most digit of each reference number corresponds to the figure in which the reference number is first used.

Figure 1:
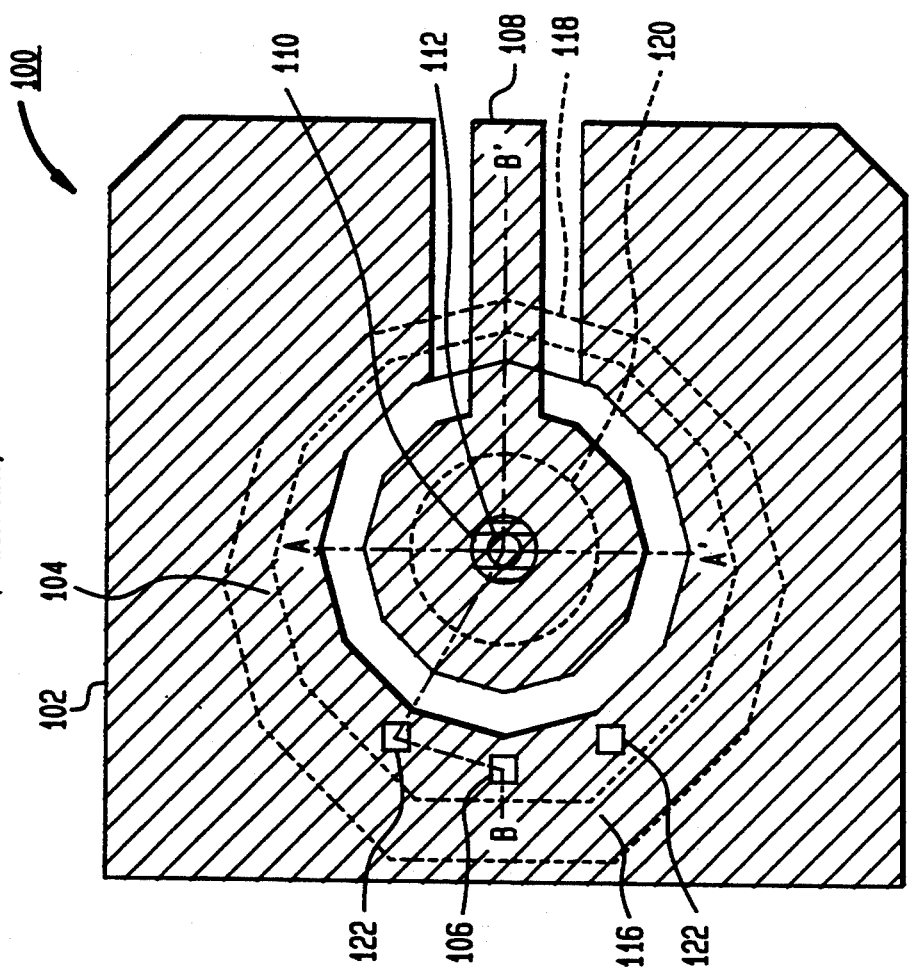
FIG. 1 shows a top view of a conventional lateral, high-voltage PNP transistor.
Figure 1:
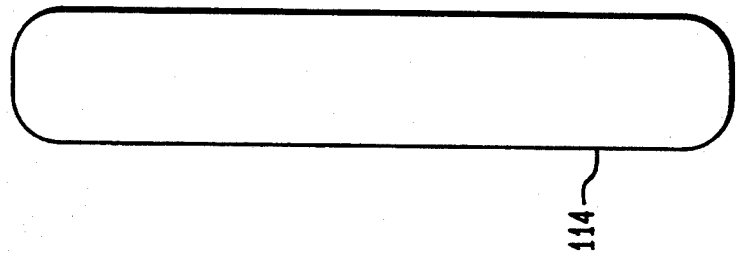
Figure 2A:
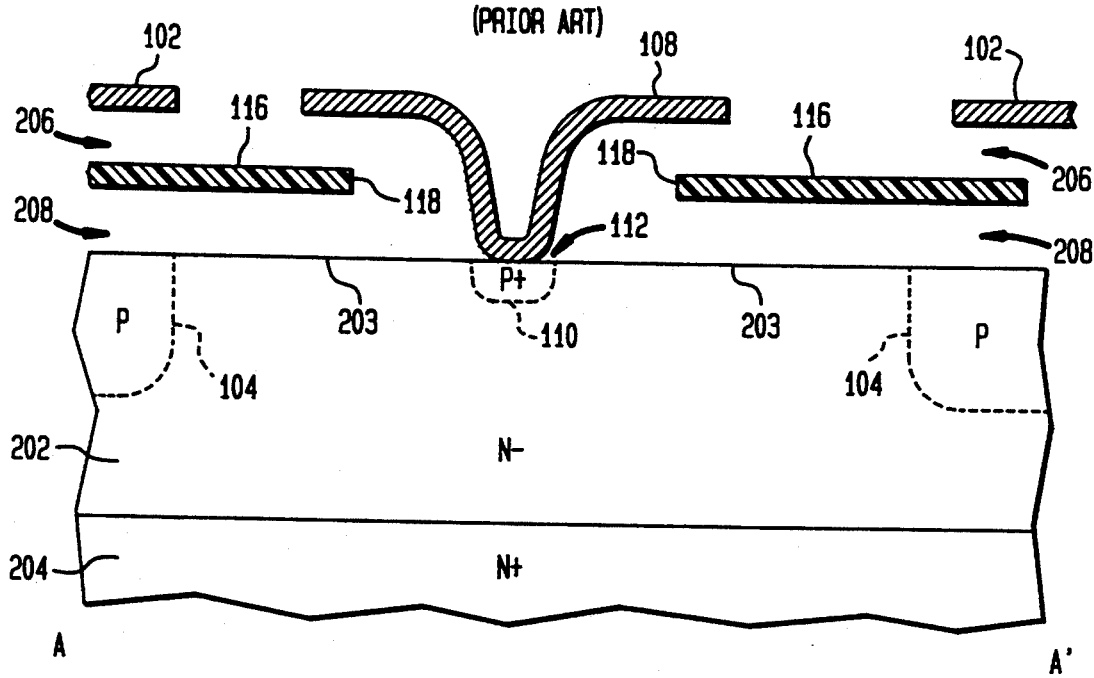
FIG. 2A shows cross-section through line A-A' of the transistor in FIG. 1.
Figure 2B:
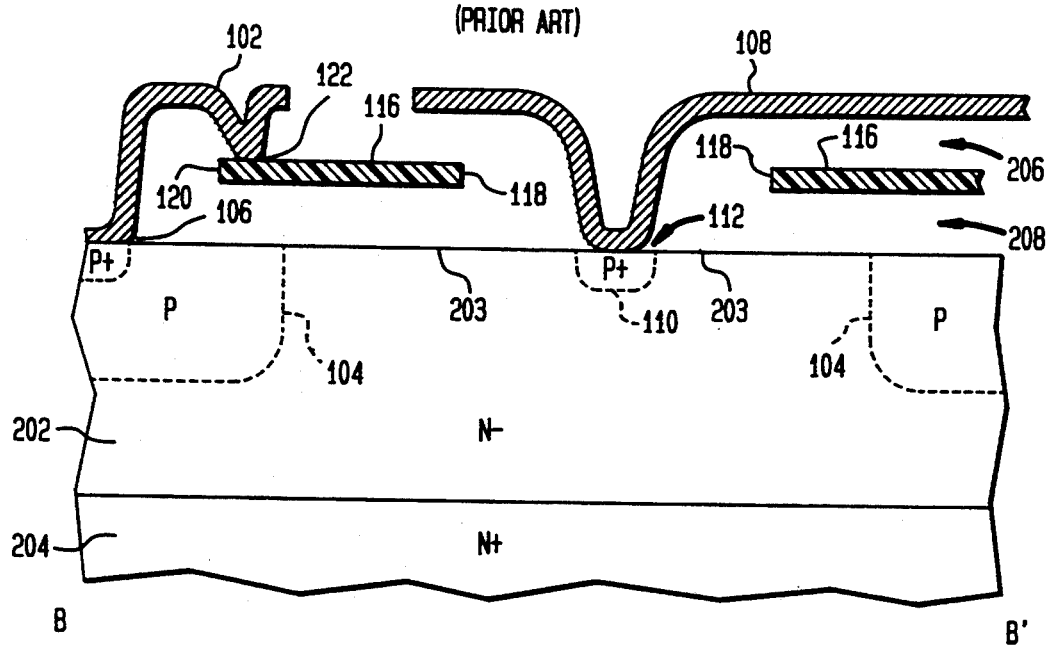
FIG. 2B shows a cross-section through line B-B' of the transistor of FIG. 1.

An example of a conventional lateral, high-voltage PNP transistor including a polysilicon shield will now be described with reference to FIGS. 1, 2A and 2B. FIG. 1 shows a representative top view of a conventional lateral, high-voltage PNP transistor. FIG. 2A shows a cross-section of the transistor in FIG. 1 through the cross-section line in FIG. 1 labeled A-A'. FIG. 2B is a representative cross-section of the transistor of FIG. 1 shown through the cross-section line in FIG. 1 labeled B-B'. Note that the cross-section B-B' is not a straight cross-section. The cross-section B-B' is staggered in order to show important physical characteristics of the transistor.

FIG. 1 shows a conventional lateral, high-voltage PNP transistor 100. Transistor 100 comprises a collector metal electrode 102, a collector region 104, and a collector contact region 106. The collector metal electrode 102 electrically contacts the collector region 104 at the collector contact region 106. The collector region 104 is formed of moderately doped P-type conductivity silicon (Si).

The transistor 100 also comprises an emitter metal electrode 108, an emitter region 110 and an emitter contact region 112. The emitter metal electrode 108 electrically contacts the emitter region 110 at the emitter contact region 112. The emitter region 110 is formed of heavily doped P+-type conductivity Si.

The transistor 100 further comprises a base contact region 114, formed of heavily doped N+-type conductivity Si. An active base region 202 (not shown in FIG. 1) of the device, referred to as a "base drift region", is described below with reference to FIGS. 2A and 2B.

The top view of FIG. 1 also shows a polycrystalline silicon (polysilicon) shield 116. The polysilicon shield 116 is defined horizontally by an inner edge 118 and an outer edge 120. Via contacts 122 are shown connecting the collector metal electrode 102 to polysilicon shield 116.

FIGS. 2a and 2B will now be described together. Both cross-sections A-A' and B-B' show the collector metal electrode 102, collector region 104, emitter metal electrode 108, emitter region 110, emitter contact region 112, and polysilicon shield 116, including edges 118 and 120. In addition, FIG. 2B shows the collector contact region 106, including a heavily doped P+-type region to better facilitate the contact in a known manner.

The left portion of cross-section B-B' deviates from being a straight section to show the via contact 122 in FIG. 2B. As clearly shown in FIG. 2B, the via contact 122 provides electrical connection between the collector metal electrode 102 and the polysilicon shield 116.

FIGS. 2A and 2B further show a lightly doped base region 202 of N−-type conductivity Si. The base region 202 includes a base drift region 203. The base drift region 203 encircles the emitter region 110. Both the base drift region 203 and emitter region 110 are encircled by the collector region 104. A heavily-doped N+-type conductivity silicon substrate 204 is used to provide electrical contact to base region 202 and base drift region 203. The substrate 204 is in electrical contact with the base contact region 114 (not shown in FIGS. 2A and 2B). Insulating layers 206 and 208 are also shown. Layers 206 and 208 are commonly formed of silicon dioxide (SiO$_2$), or the like. As would be apparent to persons skilled in the relevant art, the BCDMOS process can be used to form transistor 100.

Figure 4A:
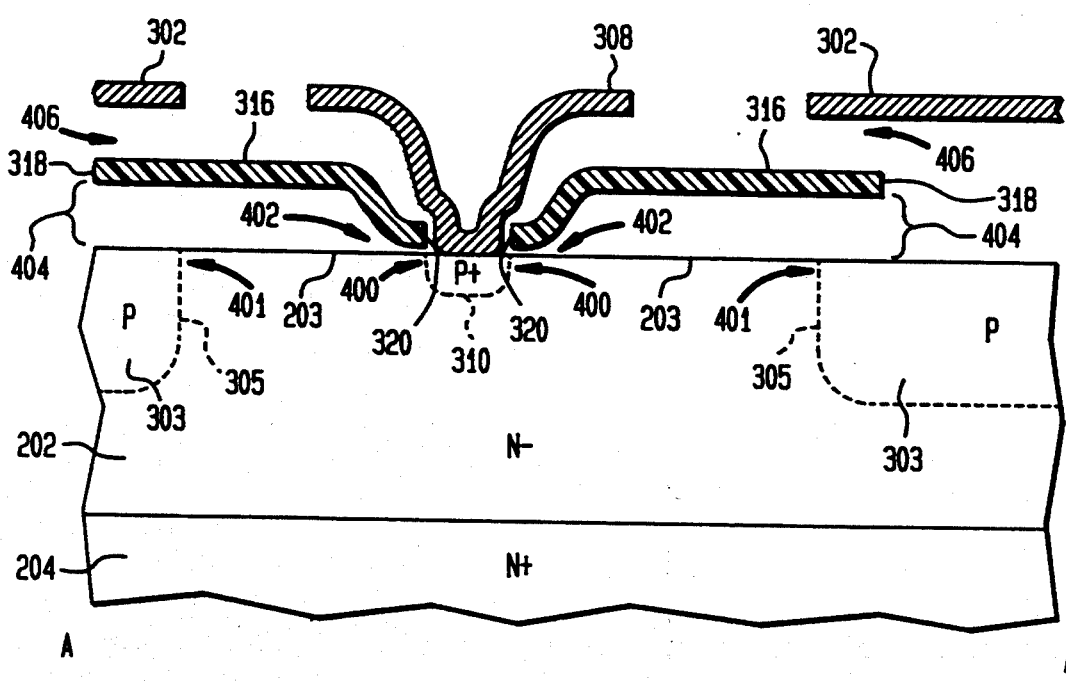
FIG. 4a shows a cross-sectional view through line A-A' of the transistor in FIG. 3 according to the present invention.
Figure 4B:
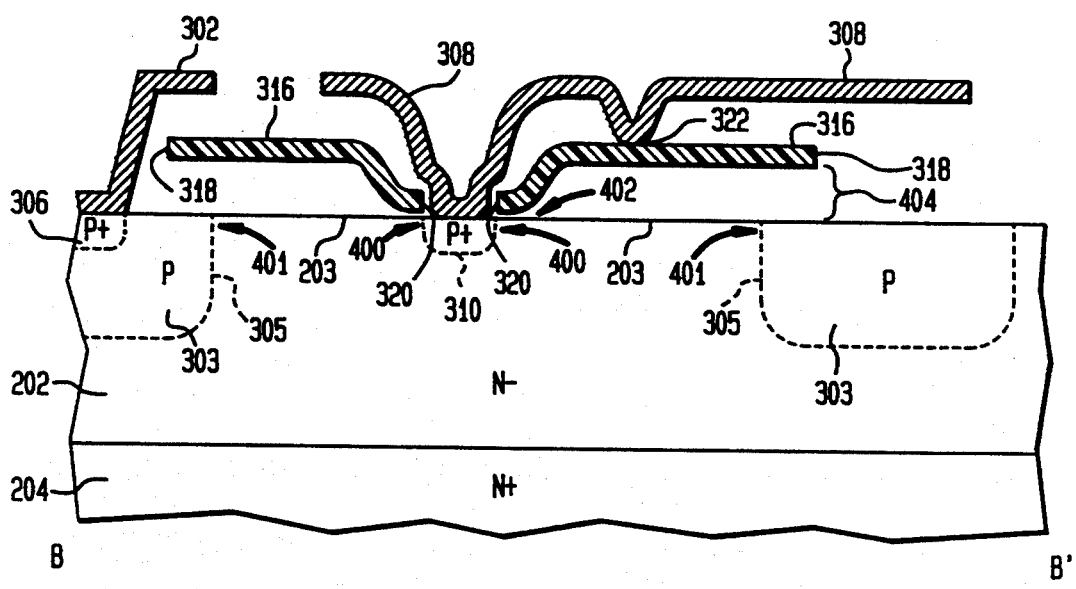
FIG. 4b shows a cross-sectional view through line B-B' of the transistor in FIG. 3 according to the present invention.
Figure 3:
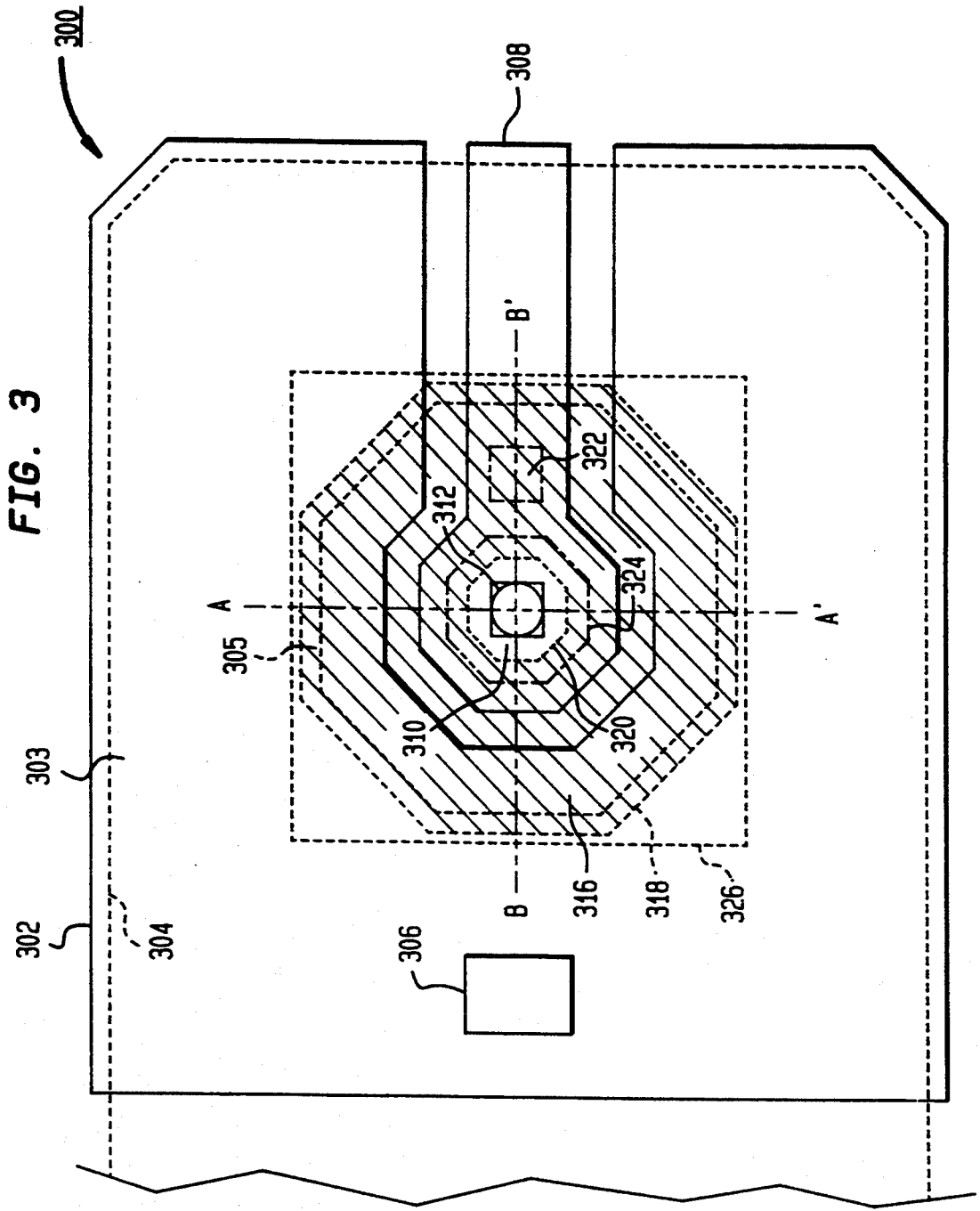
FIG. 3 shows a representative top view of a lateral, high-voltage PNP transistor according to the present invention.

A top view of a lateral, high-voltage PNP transistor 300 including a polysilicon electrostatic shield according to the present invention is shown in FIG. 3. For a simplified understanding of the features to be described in connection with FIG. 3, reference will also be made to FIGS. 4A and 4B. FIG. 4A shows a cross-sectional view of transistor 300 through a line A-A' shown in FIG. 3. In addition, FIG. 4B shows a separate cross-sectional view of transistor 300 through a line B-B' shown in FIG. 3.

The transistor 300 may be manufactured according to standard BCDMOS techniques, which is considered a single metal layer/single polysilicon layer process. The single metal (i.e., conductor) layer is patterned to form the transistor region electrode contacts. The single polysilicon layer is also considered a conductive layer and is patterned to form the electrostatic shield according to the present invention.

Referring now to FIG. 3, the lateral high-voltage PNP transistor 300 comprises a collector metal electrode 302, a collector region 303 having an outer edge 304 and an inner edge 305, and a collector contact region 306. The collector metal electrode 302 comprises aluminum, an aluminum alloy, or the like. The collector region 303 comprises a moderately doped P-type conductivity region formed in base region 202 (see FIGS. 4A and 4B). The collector metal electrode 302 makes electrical contact to the collector region 303 at the collector contact region 306. The collector region 303 has a maximum (surface) diffusion concentration of about 7E15 cm$^{-3}$ at a junction depth of between 5–6 μm from the top surface.

The transistor 300 also comprises an emitter metal electrode 308, an emitter region 310, and an emitter contact region 312. The emitter metal electrode 308 makes electrical contact to the emitter region 310 at the emitter contact region 312. The emitter metal electrode 308 comprises aluminum, an aluminum alloy, or the like. The emitter region 310 comprises a highly doped P+-type conductivity region formed in the middle of the base drift region 203 (not shown in FIG. 3), which is laterally bounded by the collector region 303. An emitter-base drift region P-N junction is formed between the emitter region 310 and base drift region 203, as shown generally at 400. Additionally, as shown at FIGS. 4A and 4B, a second P-N junction, shown generally at 401, is formed between the base drift region 203 and the inner edge 305 of collector region 303. The emitter region 310 has a surface concentration of about 2E19 cm$^{-3}$ to a junction depth of about 1–2 μm.

A base contact region for transistor 300 is not shown in FIG. 3. The base contact region for transistor 300 is substantially the same as that described above in connection with transistor 100. The base region 202 can have a concentration of about 4.45E14 cm$^{-3}$ or 3.15E14 cm$^{-3}$ (10 Ωcm and 14 Ωcm, respectively).

A two-tiered electrostatic polycrystalline silicon shield (polysilicon shield) 316 is shown by the hashed area in FIG. 3. The polysilicon shield 316 has an outer edge 318 and an inner edge 320. During manufacture of transistor 300, the inner edge 320 of polysilicon shield 316 is used in a self-align technique to form emitter region 310. Such self-alignment techniques will be apparent to persons skilled in the semiconductor manufacturing art.

The polysilicon shield 316 has a two-tier profile to improve the ability of the transistor 300 to resist dielectric breakdown of the insulating layer(s) between emitter metal electrode 308 and the base drift region 203. A dual thickness oxide layer 402,404 is used to form the two-tiered profile of the polysilicon shield 316. A transition between thin oxide layer 402 and thick oxide layer 404 is shown generally at 324 in FIG. 3. The thin oxide layer 402 is formed to approximately between 750-1,250 Å in thickness, and the thick oxide layer is between approximately 1 and 1.5 μm in thickness.

The electrostatic shielding capability of polysilicon shield 316 is improved by extending the polysilicon shield 316 over the entire base drift region 203. In the preferred embodiment of the present invention, the inner edge 320 of polysilicon shield 316 extends over the emitter region 310 so as to cover the P-N junction 400. In addition, the outer edge 318 of polysilicon shield 316 extends to cover a portion of the collector region 303 so as to extend beyond the P-N junction 401.

The electrostatic shielding capability of polysilicon shield 316 is further enhanced by its electrical connection to the emitter metal electrode 308 at a via contact 322. The polysilicon shield 316 may be doped to adjust its sheet resistivity. By doing so, the polysilicon shield 316 can more efficiently conduct charges away from the dielectric layers above the base drift region. In the preferred embodiment of the present invention, the polysilicon shield 316 is P+-type doped using a mask having the configuration indicated by reference 326 in FIG. 3. However, it should be noted that the polysilicon shield 316 may remain undoped or may be doped with a N+-type conductivity.

Figure 5:
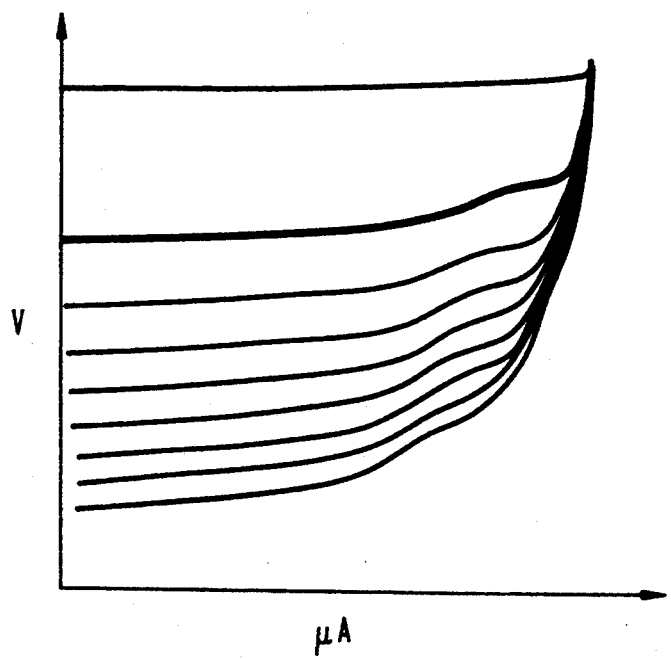
FIG. 5 shows a representative plot of the $I_{CE}$-$V_{CE}$ characteristic curves for the transistor shown in FIGS. 1, 2A and 2B.
Figure 6:
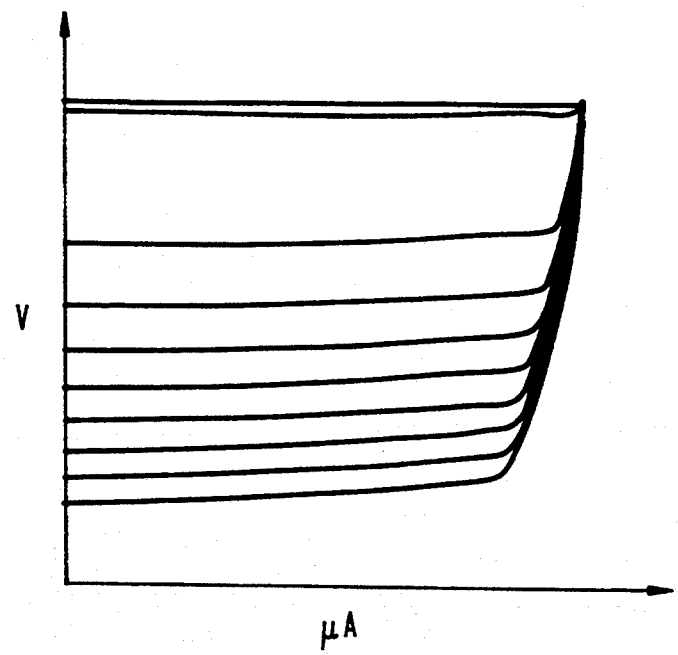
FIG. 6 flows a representative plot of the $I_{CE}$-$V_{CE}$ characteristic curves of the transistor shown in FIGS. 3, 4a and 4b according to the present invention.

According to the present invention, the "kink" in the collector emitter characteristics of the conventional lateral, high-voltage PNP transistor has been eliminated. FIG. 5 is a graphical reproduction of the $I_C$-$V_{CE}$ characteristic curves of a conventional lateral, high-voltage PNP transistor. The kink in the transistor's collector-emitter characteristics is shown at 502. FIG. 6 shows the elimination of the kink in the $I_C$-$V_{CE}$ characteristic curves of lateral, high-voltage PNP transistor according to the present invention.

Figure 7:
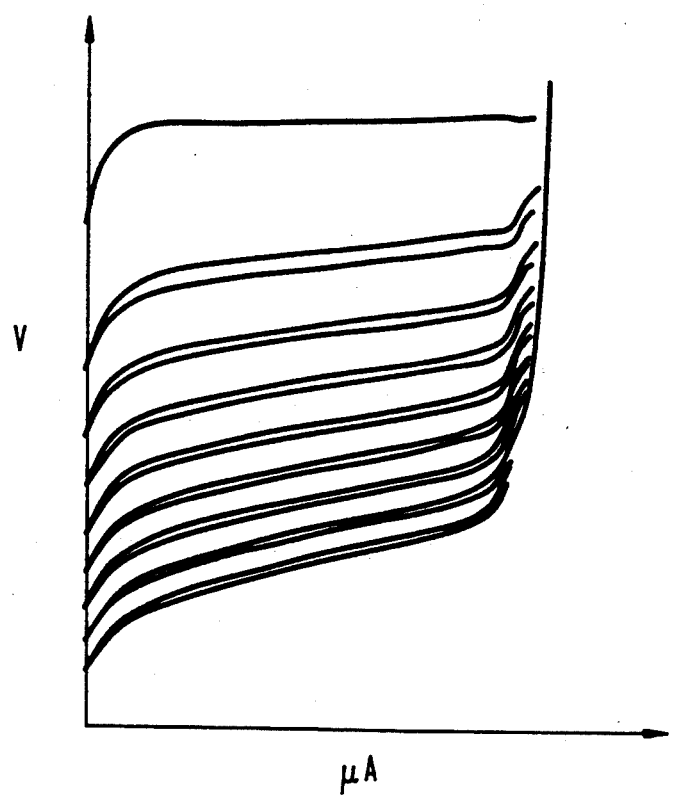
FIG. 7 shows output characteristics of a conventional lateral, high-voltage PNP transistor.
Figure 8:
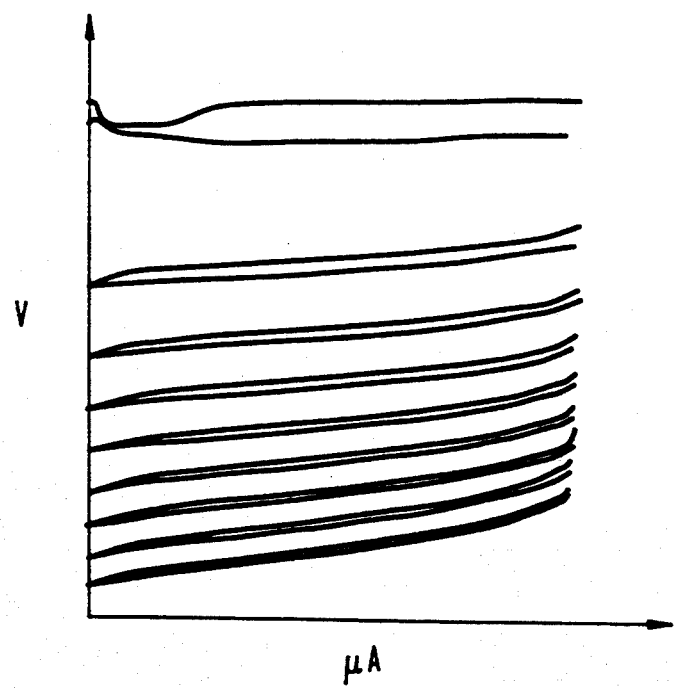
FIG. 8 shows output characteristics of a lateral, high-voltage PNP transistor according to the present invention.

Additionally, the present invention yields flatter output characteristics (e.g., higher early voltage). That is, the slope of the $I_C$-$V_{CE}$ characteristic curves has been reduced in the saturation region. FIG. 7 shows the output characteristics of a conventional transistor. Compared to FIG. 8 which shows an improved, flatter output characteristic achieved by the transistor of the present invention.

Figure 9:
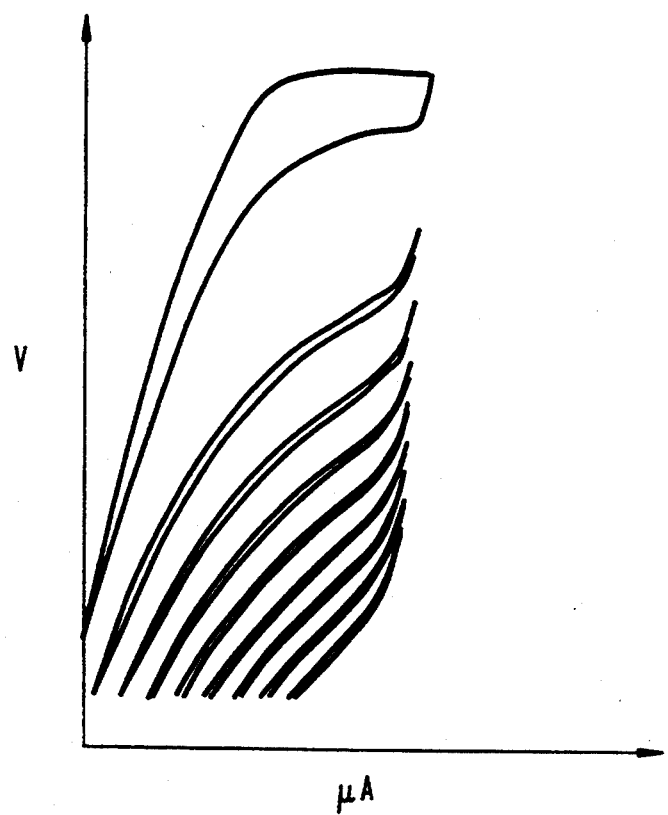
FIG. 9 shows current characteristics of a conventional lateral, high-voltage PNP transistor having a short base length.
Figure 10:
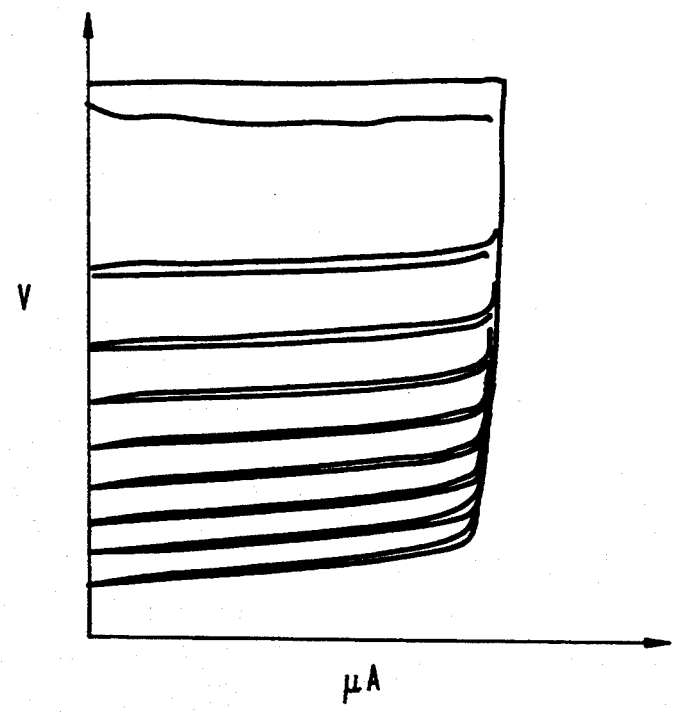
FIG. 10 shows current characteristics of a lateral, high-voltage PNP transistor having a short base length according to the present invention.

These comparative effects are more pronounced in a lateral, high-voltage PNP transistor according to the present invention having a base length which is reduced to about 22 μm. FIG. 9 shows the current characteristics of a conventional lateral, high-voltage PNP transistor having a base length of approximately 22 μm. Contrastingly, FIG. 10 shows a plot of the output current of a lateral, high-voltage PNP transistor according to the present invention having a base of about 22μ. Inspection of FIGS. 9 and 10 clearly shows the improved, flatter output characteristics achieved by the present invention.

While various embodiments of the present invention have been described above, it should be understood that they have been presented by way of example, and not limitation. It will be apparent to persons skilled in the relevant art that various changes in form and detail may be made therein without departing from the spirit and scope of the invention. Thus, the present invention should not be limited by any of the above-described exemplary embodiments, but should be defined only in accordance with the following claims and their equivalents. All cited patent documents and publications in the above description are incorporated herein by reference.

What is claimed is:

1. A semiconductor device comprising:

a semiconductor substrate with a base region, a collector region and an emitter region in a lateral arrangement, said base region having a first conductivity type, and said collector and emitter regions having a second conductivity type;

a first conductor layer patterned over said substrate with a base contact portion, a collector contact portion and an emitter contact portion, said base contact portion, said collector contact portion and said emitter contact portion contacting said base region, said collector region and said emitter region, respectively; and a second conductor layer patterned over a portion of said base region and electrically coupled to said emitter contact portion, whereby said second conductor layer functions as an electrostatic shield for said base region.

2. The semiconductor device according to claim 1, wherein said electrical coupling between said base region and said emitter contact portion comprises a direct contact between said base region and said emitter contact portion.

3. The semiconductor device according to claim 1, wherein said second conductor layer is formed between said substrate and sections of said collector and said emitter contact portions.

4. The semiconductor device according to claim 3, wherein said second conductor layer contacts said emitter region.

5. The semiconductor device according to claim 4, wherein said second conductor layer contacts said emitter contact portion.

6. The semiconductor device according to claim 1, wherein said first conductivity type is N-type and said second conductivity type is P-type.

7. The semiconductor device according to claim 6, wherein said substrate comprises silicon, said first conductor layer comprises a metal and said second conductor layer comprises polycrystalline silicon.

8. The semiconductor device according to claim 7, wherein said metal comprises aluminum.

9. The semiconductor device according to claim 1, wherein said base region comprises a surface base region that encircles said emitter region.

10. The semiconductor device according to claim 9, wherein said collector region encircles said surface base region.

11. The semiconductor device according to claim 10, wherein said second conductor layer is formed over a substantial portion of said surface base region.

12. The semiconductor device according to claim 11, wherein said second conductor layer is formed over a portion of said collector region.

13. The semiconductor device according to claim 12, wherein said substrate comprises silicon, said first conductor layer comprises a metal and said second conductor layer comprises polycrystalline silicon.

14. The semiconductor device according to claim 13, wherein said metal comprises aluminum.

15. The semiconductor device according to claim 12, wherein said second conductor layer comprises a first tier and a second tier, wherein said first tier is formed on a first oxide layer and over a first p-n junction formed between said base region and said emitter region, and said second tier is formed on a second oxide layer and over a second p-n junction formed between said base region and said collector region, said second oxide layer being thicker than said first oxide layer.

* * * * *